United States Patent

Park

[11] Patent Number: 5,985,034
[45] Date of Patent: Nov. 16, 1999

[54] OPENING FILLING APPARATUS FOR MANUFACTURING A SEMICONDUCTOR DEVICE

[75] Inventor: Tai-su Park, Seoul, Rep. of Korea

[73] Assignee: Samsung Electronics Co., Ltd., Suwon, Rep. of Korea

[21] Appl. No.: 08/925,264

[22] Filed: Sep. 8, 1997

Related U.S. Application Data

[62] Division of application No. 08/506,654, Jul. 25, 1995, Pat. No. 5,824,562.

[30] Foreign Application Priority Data

Jul. 26, 1994 [KR] Rep. of Korea .................. 94-18077

[51] Int. Cl.⁶ .................................................. C23C 16/00
[52] U.S. Cl. ...................... 118/724; 118/725; 118/641; 118/56; 118/58; 118/500; 219/405; 219/411; 392/416; 392/418
[58] Field of Search ...................... 118/641, 58, 612, 118/56, 500, 724, 725; 219/390, 405, 411, 388; 392/416, 418

[56] References Cited

U.S. PATENT DOCUMENTS

5,329,095  7/1994  Okase .................................. 219/390
5,683,518  11/1997  Moore et al. ......................... 219/411

*Primary Examiner*—Laura Edwards
*Attorney, Agent, or Firm*—Pillsbury Madison & Sutro, LLP

[57] ABSTRACT

There are disclosed an opening filling apparatus and a method for manufacturing a semiconductor device by using the same. An opening of a semiconductor device is filled by using the filling apparatus comprising: a chamber having a rotation shaft, a motor, a plurality of plates arranged in a circular form centering at the rotation shaft, and a heater; and injectors for injecting gas. When the opening of a semiconductor device such as a trench or a contact hole is filled, filling material may move down by using the centrifugal force generated by rotating the substrate, to thereby fill the opening completely without a void.

5 Claims, 6 Drawing Sheets

FIG. IC (PRIOR ART)

OPENING FILLING APPARATUS FOR MANUFACTURING A SEMICONDUCTOR DEVICE

This is a division of application Ser. No. 08/506,654, filed Jul. 25, 1995 now U.S. Pat. No. 5,824,562.

BACKGROUND OF THE INVENTION

The present invention relates to an opening filling apparatus and a manufacturing method of a semiconductor device by using the same, and more particularly, to an opening filling apparatus which can improve a filling characteristic by filling an opening such as a trench or a contact hole with centrifugal force and a manufacturing method of a semiconductor device by using the same.

As a semiconductor device is highly integrated, a contact is decreased in dimension while a device isolation region used for insulating one device from another is decreased. Therefore, when a trench for isolating each device or a contact hole for connecting conductive layers is formed, it is difficult to fill the trench or the contact hole without a void. Currently, a method for filling the trench or the contact hole without the void is under study.

Referring to FIGS. 1A through 1C, disadvantages of the conventional method for filling a trench will be explained.

In FIG. 1A, reference numeral 10 denotes a semiconductor substrate, 15 denotes an insulating layer, 20 denotes a void formed due to a poor step coverage.

In general, for isolating one device from another, a insulation material, for example, an oxide is deposited on semiconductor substrate 10 by using the chemical vapor deposition (CVD) method, thereby forming insulating layer 15 for filling a trench formed on semiconductor substrate 10. At this time, a void 20 is formed inside the trench due to a poor step coverage caused by the high-integration of the semiconductor device. As the succeeding heat treatment process is performed, the surface area of void 20 is decreased in size and therefore round hole-shaped void 25 is formed inside the trench (refer to FIG. 1B).

FIG. 1C is a scanning electron microscope (SEM) photograph of the hole-shaped void generated in the actual manufacturing process. Since the SEM photograph of the void is taken after the oxide stain treatment for controlling a contrast, the void is shown in larger size than the real one.

When an etching margin is too small, void 25 is exposed in the etching step and the exposed region is then filled with gate material, so that a gate stringer is generated or undesired impurity is doped into the surface of the void exposed at the ion-implantation. Therefore, the oxide layer cannot completely function as a device isolation region.

Referring to FIGS. 2A and 2B, disadvantages of the conventional method for filling a contact hole will be explained.

In FIG. 2A, the reference numeral 50 denotes a semiconductor substrate, 55 denotes an insulating layer where a contact hole is formed, and 60 denotes an interconnection layer for forming a contact hole.

The interconnection layer 60 is formed, for example, by depositing aluminum. In this case, however, a poor step coverage occurs as the contact hole is decreased in dimension due to a high-integration. Also, an agglomeration phenomenon that aluminum is conglomerated on the contact hole occurs in the succeeding heat treatment process, thereby causing a poor contact hole problem (refer to FIG. 2B).

SUMMARY OF THE INVENTION

An object of the present invention is to provide an apparatus for manufacturing a semiconductor which can improve an opening filling characteristic.

Another object of the present invention is to provide a method for manufacturing a semiconductor by using the above apparatus.

To achieve the first object, the present invention provides an opening filling apparatus comprising: a chamber having a rotation shaft, a motor for rotating the rotation shaft; a plurality of plates arranged in a circular form centering at the rotation shaft and coupled to the rotation shaft, and a heater mounted toward the plates; and means for injecting gas to the chamber.

The above apparatus further comprises a wafer load lock system for opening and shutting the chamber and a wafer transport system for mounting a wafer in the chamber. It is preferable that a halogen lamp is used for the heater, and that the means for injecting gas is for injecting nitrogen gas or argon gas.

To achieve the second object of the present invention, there is provided a manufacturing method of a semiconductor device comprising the steps of: forming an opening on a semiconductor substrate; coating a material layer on the opening so as to fill the opening; and rotating the substrate at a relatively high speed, and simultaneously heating the substrate up to the temperature at which the material layer can flow, thereby filling the opening with the material layer completely.

When the opening is a trench formed for isolating the devices, it is preferable that the material layer is formed of a silicon oxide. Also, when the opening is a contact hole, the material layer is formed of aluminum. Meanwhile, the rotating and heating processes are performed under nitrogen or argon gas atmosphere, to thereby prevent the substrate from being oxidized.

According to the present invention, when an opening such as a trench or a contact hole is filled, a filling material is caused to flow down to the inside of the opening by using a centrifugal force generated by rotating the substrate, whereby the opening can be filled completely without a void.

BRIEF DESCRIPTION OF THE DRAWINGS

The above objects and advantages of the present invention will become more apparent by describing in detail a preferred embodiment thereof with reference to the attached drawings in which:

FIGS. 1A through 1C are sectional views for explaining problems of a conventional method for filling a trench.

DETAILED DESCRIPTION OF THE INVENTION

Hereinafter, the present invention will be explained in detail with reference to the attached drawings.

Figure 1A:
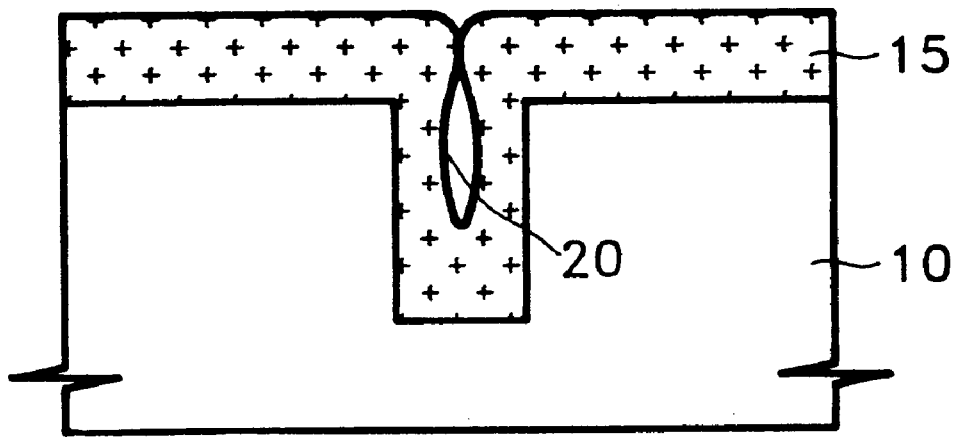
Figure 1B:
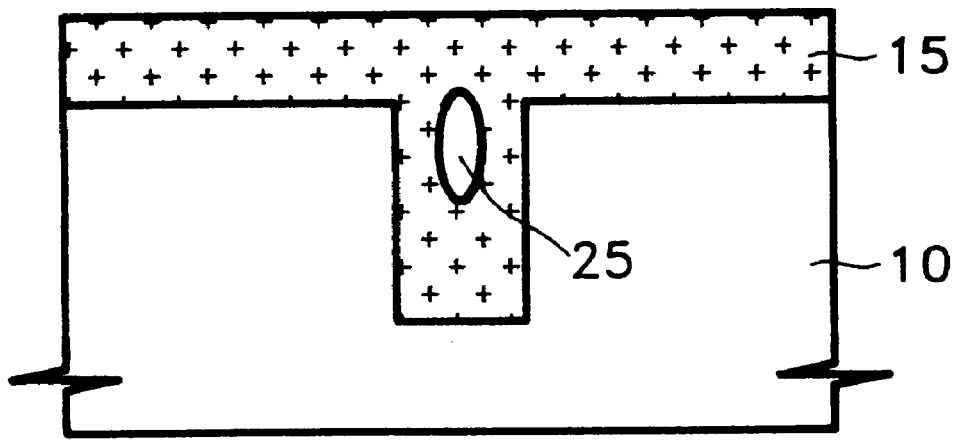
Figure 2A:
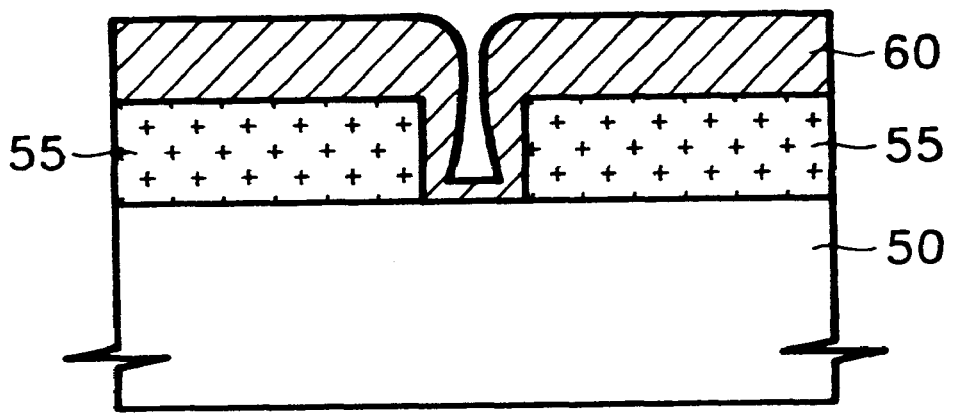
FIGS. 2A and 2B are sectional views for explaining problems of a conventional method for filling a contact hole.
Figure 2B:
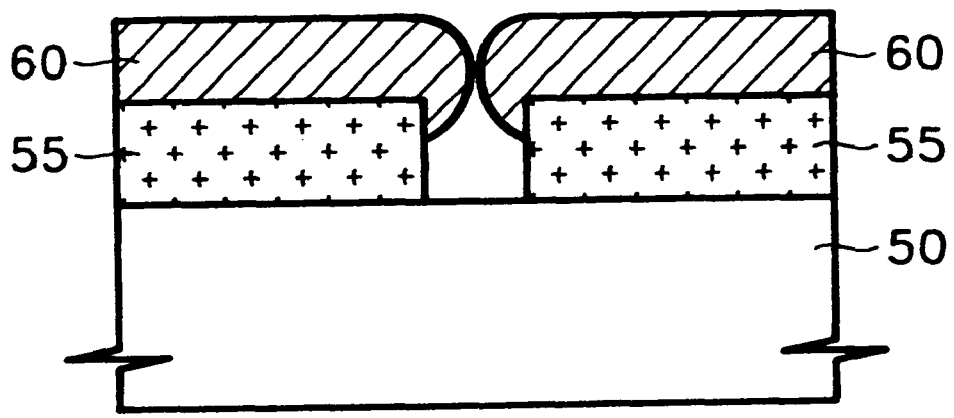
Figure 3:
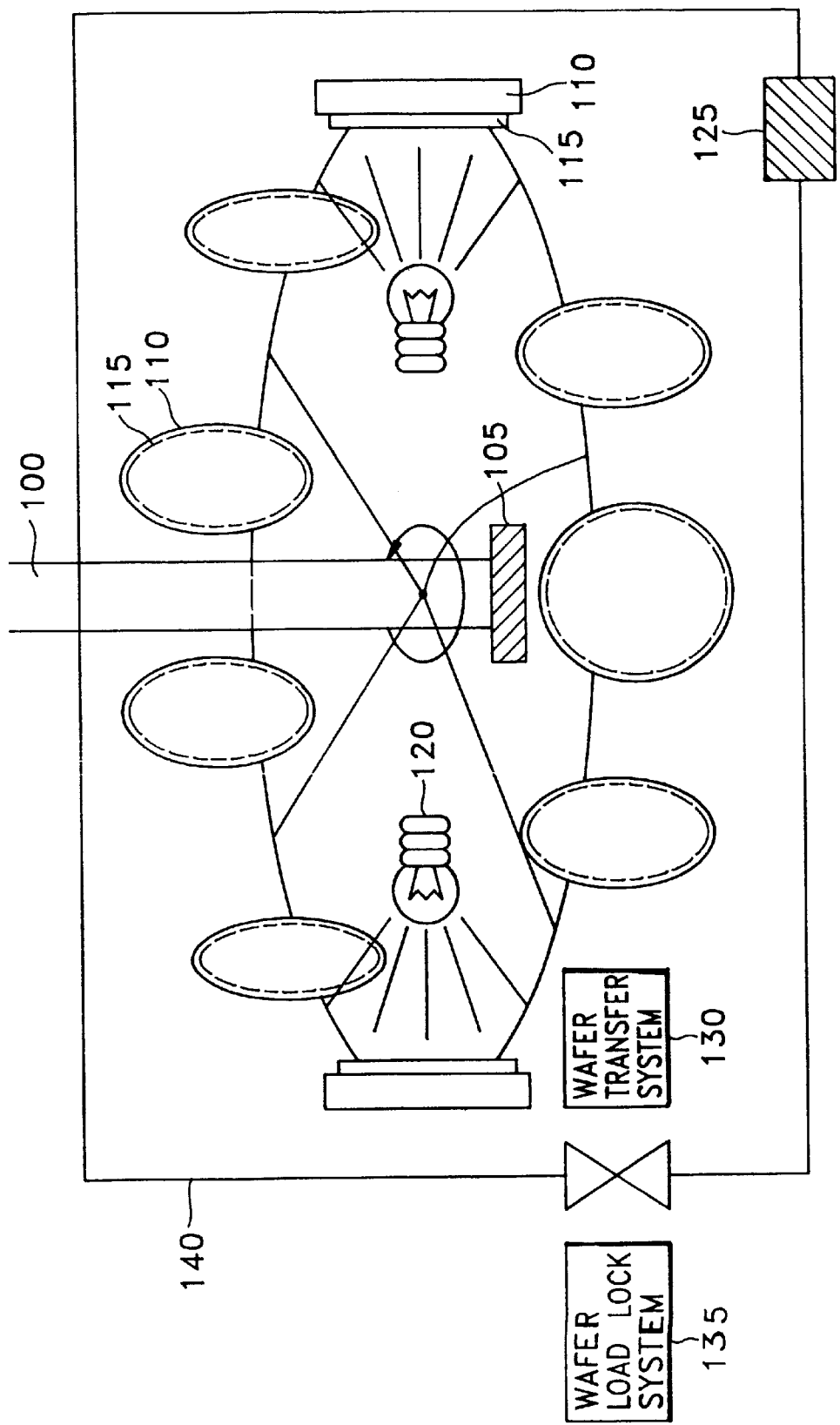
FIG. 3 is diagram schematically showing an apparatus for manufacturing a semiconductor device according to the present invention.

FIG. 3 is diagram schematically showing an apparatus for manufacturing a semiconductor device according to the present invention.

An opening filling apparatus of the present invention comprises: a chamber 140 having a rotation shaft 100, a motor 105 for rotating rotation shaft 100, a plurality of plates 110 positioned in a vertical state, connected to rotation shaft 100, and arranged in a circular form centering at rotation shaft 100, and a heater 120 located inside the circle and mounted toward the plates; and a gas injector 125 for injecting gas to the chamber.

The chamber can further comprise a wafer transport system 130 for mounting a wafer to the plates. The opening filling apparatus can further comprise a wafer load lock system 135 for opening and shutting the chamber.

The number of heaters can be increased as necessary. Also, plates 110 may be slanted with respect to the rotation shaft so that a centrifugal force perpendicular to the direction of gravity is generated at various slant angles with respect to the plates.

The operation of the opening filling apparatus is briefly explained as follows. Rotation shaft 100 is rotated by operating motor 105, and a plurality of plates 110 connected to rotation shaft 100 by connectors 115 and each having a wafer mounted thereon are then rotated. Simultaneously, a wafer is heated by operation of heater 120, for example a halogen lamp, located inside the circular arrangement of plates.

At this time, as the centrifugal force is applied onto the wafer by the above rotation, the material layer formed on the wafer for filling the opening is subjected to the centrifugal force so as to be pressed onto the lower part of the wafer. Also, the wafer is heated by heater 120 and thus the material layer flows down, to thereby fill the opening with ease without a void.

Meanwhile, it is preferable that nitrogen gas or argon gas is injected to chamber 140 from gas injector 125 so as to prevent the oxidation reaction.

FIGS. 4A through 4D are sectional views for illustrating a method for filling an opening according to a first embodiment of the present invention.

Figure 4A:
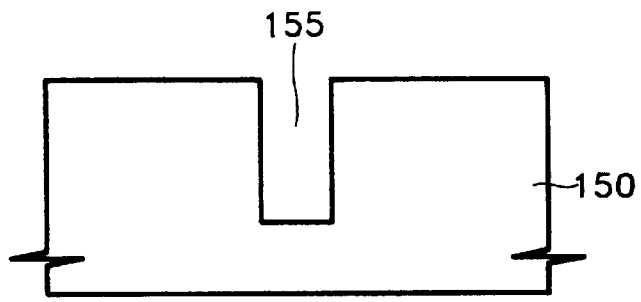
FIGS. 4A through 4D are sectional views for illustrating a method for filling an opening according to a first embodiment of the present invention.

Referring to FIG. 4A, a trench 155 with a predetermined depth is formed in the device isolation region of a semiconductor substrate 150. As the semiconductor device is highly integrated, a width of trench 155 is narrowed gradually, as described above.

Figure 4B:
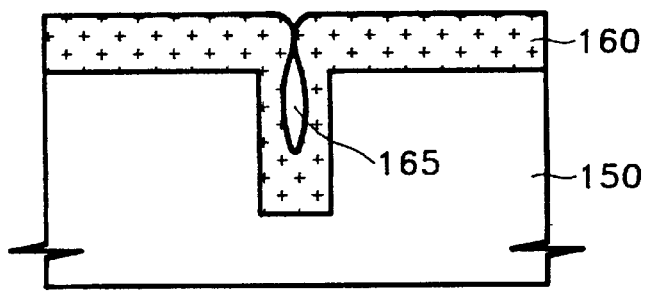

Referring to FIG. 4B, an insulating layer, for example, an oxide layer 160 is formed on the overall surface of semiconductor substrate 150 where trench 155 is formed. Oxide layer 160 is formed by depositing an oxide on the overall surface of the substrate by using the chemical vapor deposition method, thereby filling the trench. At this time, a void 165 can be formed inside the trench due to a poor step coverage caused by the high-integration.

Figure 4C:
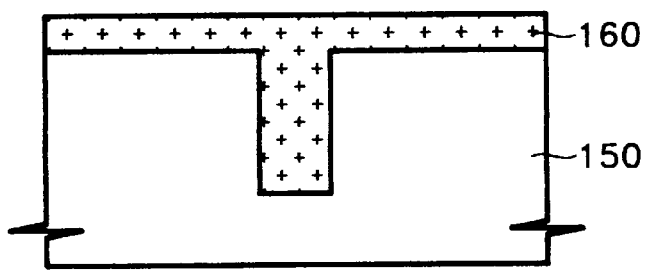

Thereafter, semiconductor substrate 150 where oxide layer 160 is formed is mounted to the opening filling apparatus as shown in FIG. 3A, and rotated then at a high speed. At this time, semiconductor substrate 150 is mounted vertically or slantly. While rotating, the substrate is heated-up to the temperature at which the oxide can flow by using the heater (for example, halogen lamp). By the centrifugal force generated by the rotation, the oxide capable of flowing moves under the trench and fills void 165 formed inside the trench. Therefore, oxide layer 160 on the substrate is slightly decreased in thickness (FIG. 4C). The rotating and heating processes are performed in nitrogen or argon gas atmosphere, to thereby prevent the substrate from being oxidized.

Figure 4D:
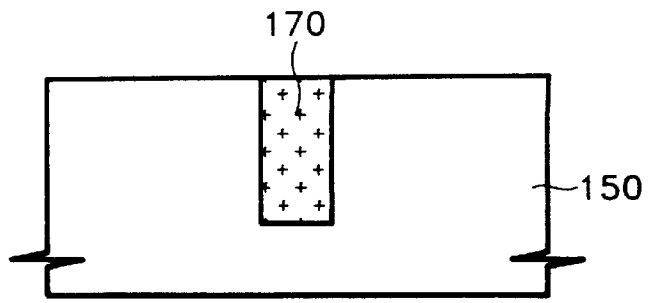

Next, oxide layer 160 is etched back to complete the formation of a device isolation region 170 on substrate 150 (FIG. 4D).

Figure 5A:
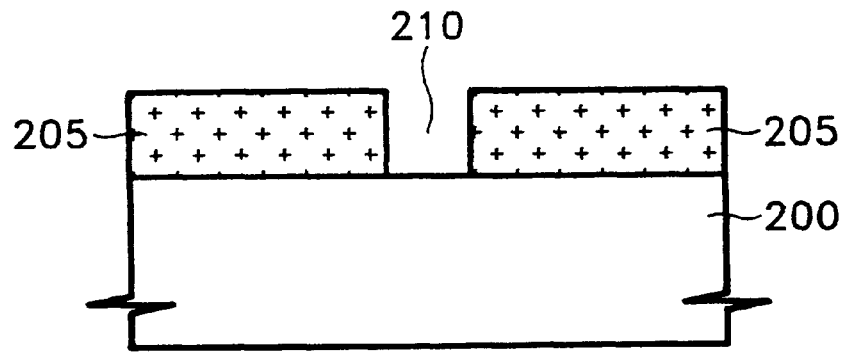
FIGS. 5A through 5C are sectional views for illustrating a method for filling an opening according to a second embodiment of the present invention.
Figure 5B:
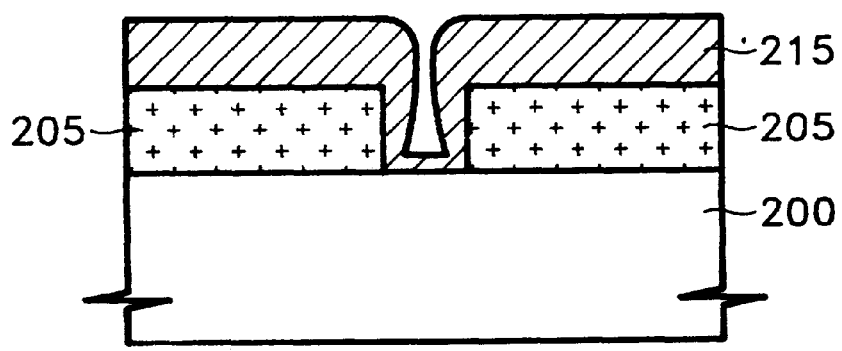
Figure 5C:
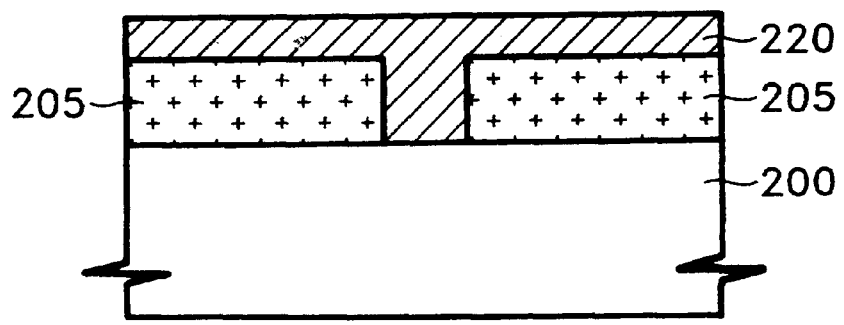

FIGS. 5A through 5C are sectional views for illustrating a method for filling an opening according to a second embodiment of the present invention.

Referring to 5A, an insulating layer 205 is formed on a semiconductor substrate 200, and an opening such as a contact hole 210 is formed on insulating layer 205.

Referring to 5B, metal such as aluminum is deposited on the overall surface of insulating layer 205 having contact hole 210, thereby forming an aluminum layer 215.

Thereafter, substrate 200 where aluminum layer 215 is formed is mounted to the filling apparatus as shown in FIG. 3A, and rotated then at a high speed. At this time, in the same manner as the first embodiment, semiconductor substrate 200 is mounted vertically or slantly. Similarly, the rotating substrate is heated to the temperature at which aluminum can flow by using the heater (for example, a halogen lamp). The aluminum capable of flowing moves into contact hole 210 by the centrifugal force generated by the rotation and fills contact hole 210, resulting in a layer 220 having a slightly reduced thickness (FIG. 5C).

According to another embodiment of the present invention, the material layer is formed of impurity doped silicon oxide, for example, borophosphosilicate glass or phosphosilicate glass.

According to the present invention, in the filling process of an opening such as a trench or a contact hole, the substrate is rotated and simultaneously heated so that the material layer may flow down, thereby the void formation or the agglomeration phenomenon which occurs in the conventional method for manufacturing the highly integrated semiconductor device can be prevented.

The present invention is not limited to the above embodiments and many other variations can be available to those skilled in this art.

What is claimed is:

1. An opening filling apparatus of a semiconductor device comprising:

a chamber including a rotation shaft, a motor for rotating said rotation shaft, a plurality of plates for holding semiconductor wafers arranged in a circular form centering at said rotation shaft and in parallel with said rotation shaft, a connector for connecting said rotation shaft to said plates, and a heater mounted toward said plates; and injectors in fluid communication with said chamber for injecting gas therein.

2. An opening filling apparatus as claimed in claim 1, said apparatus further comprising:

a wafer load lock system for opening and shutting said chamber; and a wafer transport system for mounting a wafer in said chamber.

3. An opening filling apparatus as claimed in claim 1, wherein said heater is a halogen lamp.

4. An opening filling apparatus as claimed in claim 1, wherein said means for injecting gas is to inject gas selected from the group consisting of nitrogen gas and argon gas.

5. An opening filling apparatus as claimed in claim 1, wherein said heater is located between said shaft and plates.

* * * * *